(12) United States Patent
Fujiwara et al.

(10) Patent No.: US 8,436,778 B2
(45) Date of Patent: May 7, 2013

(54) ANTENNA DUPLEXER AND COMMUNICATION DEVICE USING THE SAME

(75) Inventors: Joji Fujiwara, Osaka (JP); Tetsuya Tsurunari, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 407 days.

(21) Appl. No.: 12/989,807

(22) PCT Filed: Nov. 20, 2009

(86) PCT No.: PCT/JP2009/006256
§ 371 (c)(1),
(2), (4) Date: Oct. 27, 2010

(87) PCT Pub. No.: WO2010/061559
PCT Pub. Date: Jun. 3, 2010

(65) Prior Publication Data
US 2011/0043428 A1 Feb. 24, 2011

(30) Foreign Application Priority Data
Nov. 27, 2008 (JP) ................. 2008-302080

(51) Int. Cl.
*H01Q 1/00* (2006.01)

(52) U.S. Cl.
USPC ............ 343/722; 343/750; 343/758; 333/133

(58) Field of Classification Search .................. 343/722, 343/750, 758, 702; 333/133
See application file for complete search history.

(56) References Cited

U.S. PATENT DOCUMENTS

| 5,999,069 A | 12/1999 | Ushiroku |
| 6,747,530 B1 | 6/2004 | Selmeier |

(Continued)

FOREIGN PATENT DOCUMENTS

| JP | 11-055067 | 2/1999 |
| JP | 2003-110404 | 4/2003 |

(Continued)

OTHER PUBLICATIONS

International Search Report issued Dec. 15, 2009 in International (PCT) Application No. PCT/JP2009/006256.

*Primary Examiner* — Dieu H Duong
(74) *Attorney, Agent, or Firm* — Wenderoth, Lind & Ponack, LLP.

(57) ABSTRACT

An antenna duplexer includes a transmission filter and a reception filter both coupled with an antenna terminal. A pass band of the transmission filter is lower than a pass band of the reception filter. The transmission filter includes a first series resonator coupled with a first terminal, a second series resonator connected to the first series resonator at a first node, a first parallel resonator connected to a first port of the first series resonator, a second parallel resonator connected to a first node and the first parallel resonator at a second node, a third parallel resonator connected to the first node, a fourth parallel resonator connected to the third parallel resonator at a third node, a first inductance element coupled with the second node and a ground, and a second inductance element coupled with the third node and the ground. The first and second parallel resonators and the first inductance element produce an attenuation pole at a frequency lower than a pass band of the transmission filter. The third and fourth parallel resonators and the second inductance element produce an attenuation pole at a frequency higher than a pass band of the transmission filter. The inductance of the second inductance element is lower than the inductance of the first inductance element. In this antenna duplexer, the transmission filter sufficiently suppresses a spurious caused by harmonics contained in a transmission signal.

7 Claims, 3 Drawing Sheets

U.S. PATENT DOCUMENTS

| | | | |
|---|---|---|---|
| 7,573,354 B2 * | 8/2009 | Nishihara et al. | 333/133 |
| 2003/0062969 A1 | 4/2003 | Inoue | |
| 2007/0111674 A1 | 5/2007 | Iwamoto et al. | |
| 2009/0002095 A1 * | 1/2009 | Terada et al. | 333/133 |
| 2011/0018653 A1 * | 1/2011 | Bradley et al. | 333/133 |

FOREIGN PATENT DOCUMENTS

| | | |
|---|---|---|
| JP | 2004-007250 | 1/2004 |
| JP | 2007-142560 | 6/2007 |
| WO | 01/05031 | 1/2001 |

* cited by examiner

FIG. 4 – PRIOR ART
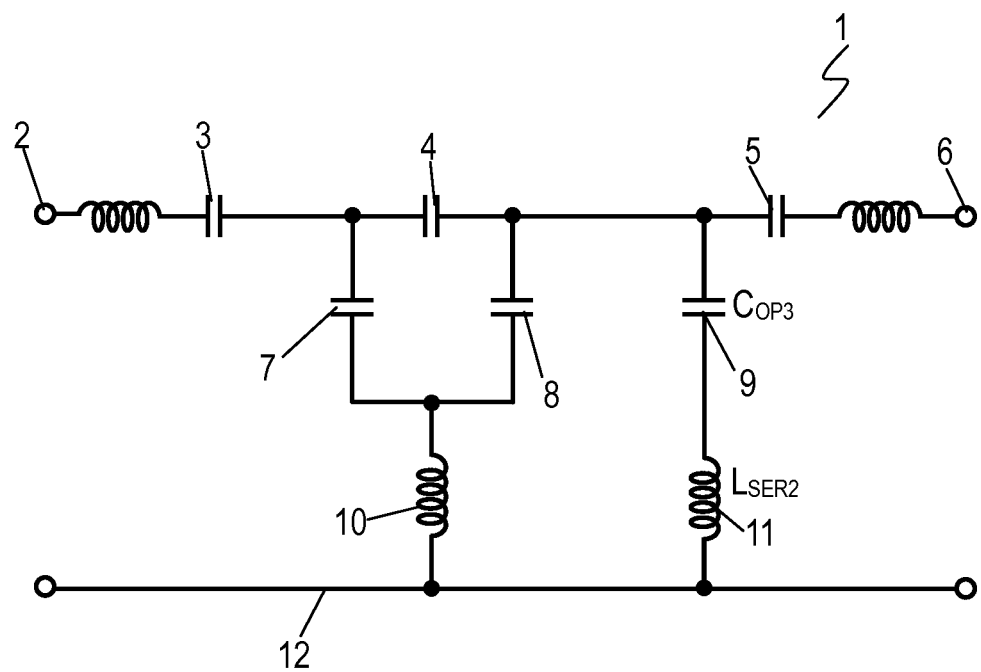

US 8,436,778 B2

ANTENNA DUPLEXER AND COMMUNICATION DEVICE USING THE SAME

This application is a U.S. national stage application of the PCT International Application No. PCT/JP2009/006256, filed Nov. 20, 2009.

TECHNICAL FIELD

The present invention relates to an antenna duplexer used in a communication device, such as a mobile phone.

BACKGROUND ART

FIG. 4 is an equivalent circuit diagram of a transmission filter of a conventional antenna duplexer described in patent document 1. The conventional antenna duplexer includes an antenna terminal, transmission filter 1 connected to the antenna terminal, and a reception filter connected to the antenna terminal. A pass band of the reception filter is lower than that of the transmission filter.

Transmission filter 1 includes input terminal 2, series resonator 3 connected to input terminal 2, series resonator 4 connected to an output port of series resonator 3, series resonator 5 connected to an output port of series resonator 4, and output terminal 6 connected to an output port of series resonator 5. Transmission filter 1 also includes parallel resonator 7 having one port connected between series resonator 3 and series resonator 4, parallel resonators 8 and 9 having respective one port connected between series resonator 4 and series resonator 5. Transmission filter 1 further includes inductance elements 10 and 11. Inductance element 10 s electrically connected between ground 12 and a node at which another port of resonator 7 and another port of resonator 8 are connected. Inductance element 11 is connected between ground 12 and another port of parallel resonator 9.

In transmission filter 1, parallel resonator 7, parallel resonator 8 and inductance element 10 produce an attenuation pole at a frequency lower than a transmitting frequency band. Parallel resonator 9 and inductance element 11 produce an attenuation pole at a frequency higher than a transmitting band width.

Transmission filter 1 is a ladder type filter. In one parallel arm, parallel resonator 9 having small capacitance $C_{OP3}$ and inductance element 11 having inductance $L_{SER2}$ produce an attenuation pole at frequency F1 higher than the pass band that is the transmission band width of the transmission filter.

$$F_1 = 1/\{2\pi(L_{SER2}C_{OP3})^{1/2}\}$$

Frequency F is raised to increase an attenuation at a frequency higher than the transmission frequency band, thereby suppressing harmonics contained in the transmission signal input from the input terminal.

An LC series resonant circuit composed of parallel resonator 9 and inductance element 11 has impedance $Z_1$.

$$Z1 = j\omega L_{SER2} + 1/(j\omega C_{OP3})$$

In transmission filter 1, since capacitance $C_{OP3}$ of parallel resonator 9 is small, impedance $Z_1$ is high at the frequency higher than the transmission frequency band. Consequently, the conventional antenna duplexer hardly obtains a sufficient amount of attenuation at the frequency higher than the transmission frequency band, accordingly being prevented from sufficiently suppressing a spurious caused by harmonics contained in the transmission signal.

Patent Document 1: WO 01/005031

SUMMARY OF THE INVENTION

An antenna duplexer includes a transmission filter and a reception filter both coupled with an antenna terminal. A pass band of the transmission filter is lower than a pass band of the reception filter. The transmission filter includes a first series resonator coupled with a first terminal, a second series resonator connected to the first series resonator at a first node, a first parallel resonator connected to a first port of the first series resonator, a second parallel resonator connected to a first node and the first parallel resonator at a second node, a third parallel resonator connected to the first node, a fourth parallel resonator connected to the third parallel resonator at a third node, a first inductance element coupled with the second node and a ground, and a second inductance element coupled with the third node and the ground. The first and second parallel resonators and the first inductance element produce an attenuation pole at a frequency lower than a pass band of the transmission filter. The third and fourth parallel resonators and the second inductance element produce an attenuation pole at a frequency higher than a pass band of the transmission filter. The inductance of the second inductance element is lower than the inductance of the first inductance element.

In this antenna duplexer, the transmission filter sufficiently suppresses a spurious caused by harmonics contained in a transmission signal.

BRIEF DESCRIPTION OF THE DRAWING

FIG. 4 is an equivalent circuit diagram of a conventional antenna duplexer.

DETAILED DESCRIPTION OF THE PREFERRED EMBODIMENTS

Figure 1A:
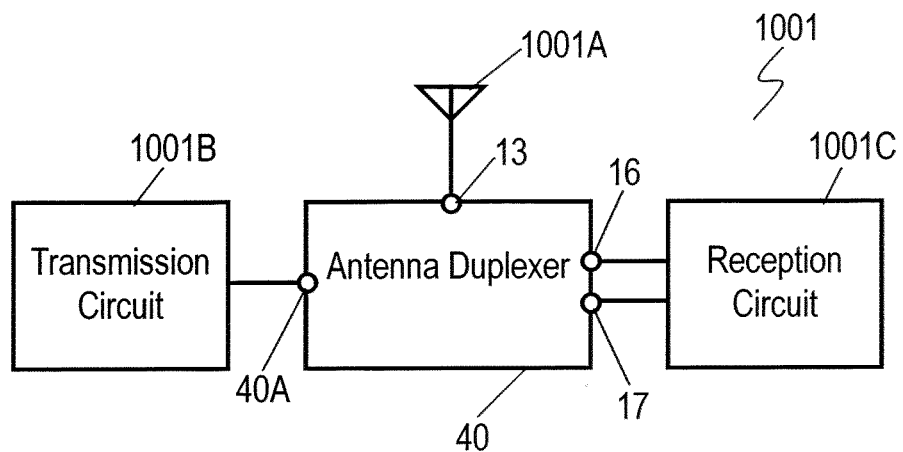
FIG. 1A is a block diagram of a communication device according to an exemplary embodiment of the present invention.

FIG. 1A is a block diagram of communication device 1001 according to an exemplary embodiment of the present invention.

Communication device 1001 is a mobile phone, such as a W-CDMA/UMTS mobile phone. Communication device 1001 includes antenna duplexer 40. Antenna duplexer includes antenna terminal 13, transmission terminal 40A, and reception terminals 16 and 17. Communication device 1001 further includes antenna 1001A connected with antenna terminal 13 of antenna duplexer 40, transmission circuit 1001B connected to transmission terminal 40A of antenna duplexer 40, and reception circuit 1001C connected to reception terminals 16 and 17 of antenna duplexer 40. Transmission circuit 100B inputs a transmission signal to antenna duplexer 40 through transmission terminal 40A. The transmission signal passes through antenna duplexer 40 and is radiated from antenna 1001A as a radio wave. Antenna 1001A receives a reception signal and input the signal through antenna terminal 13. The received signal passes through antenna duplexer 40, reception terminals 16 and 17 to reception circuit 1001C. Reception circuit 1001C demodulates and decodes the signal to reproduce an image and a sound.

Figure 1B:
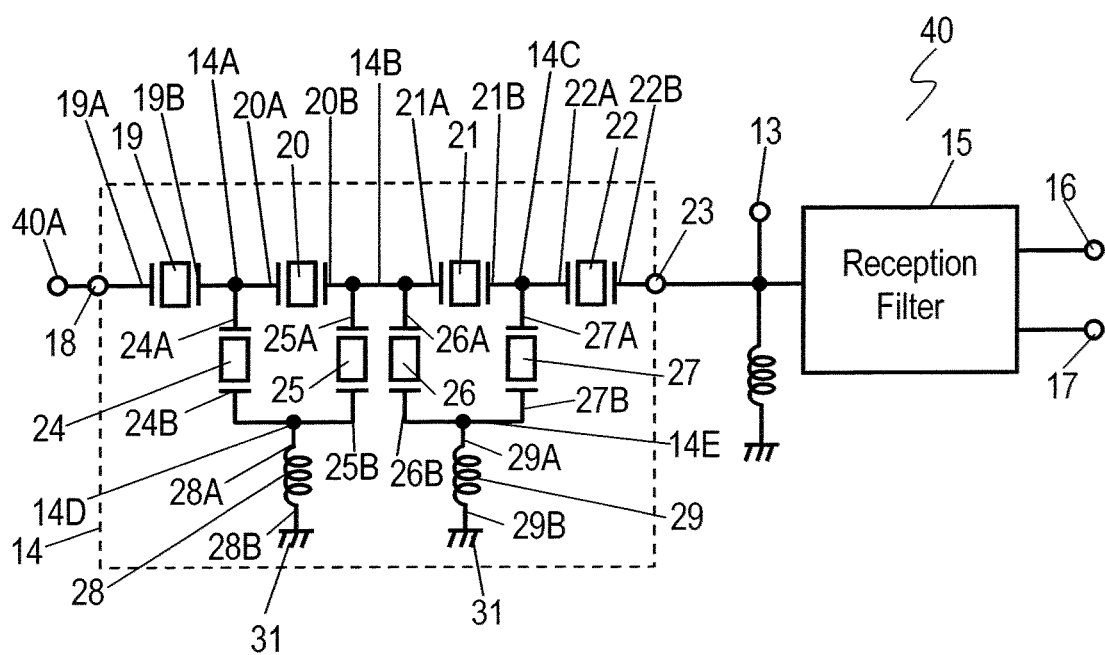
FIG. 1B is a circuit diagram of an antenna duplexer according to the embodiment.

FIG. 1B is a circuit diagram of antenna duplexer 40. Antenna duplexer 40 includes antenna terminal 13 adapted to be connected with antenna 1001A, transmission filter 14 coupled with antenna terminal 13, and reception filter 15 coupled with antenna terminal 13. Reception filter 15 outputs the received signal from terminals 16 and 17 in balance. Transmission filter 14 has a pass band ranging from a minimum frequency to a maximum frequency. Similarly, reception filter 15 has a pass band ranging from a minimum frequency to a maximum frequency. According to the embodiment, a pass band of transmission filter 14 does not overlap that of reception filter 15 but is lower than that of reception filter 15. In other words, the maximum frequency of the pass band of transmission filter 14 is lower than the minimum frequency of the pass band of reception filter 15.

Transmission filter 14 is a ladder type filter composed of resonators, such as surface acoustic wave elements or boundary acoustic elements, which are connected in a ladder shape. Transmission filter 14 includes terminal 18 connected to transmission terminal 40A having the transmission signal is input thereto, and terminal 23 which outputs the transmission signal to antenna terminal 13. Transmission filter 14 further includes series resonator 19, series resonator 20, series resonator 21 and series resonator 22 which are connected in series between terminal 18 and 23 in this order from terminal 18. Series resonator 19 has ports 19A and 19B for inputting and outputting a signal. Series resonator 20 has ports 20A and 20B for inputting and outputting a signal. Series resonator 21 has ports 21A and 21B for inputting and outputting a signal. Series resonator 22 has ports 22A and 22B for inputting and outputting a signal. Port 19A of series resonator 19 is connected to, i.e., coupled with terminal 18. Port 19B of series resonator 19 is connected to port 20A of series resonator 20 at node 14A. Port 20B of series resonator 20 is connected to port 21A of series resonator 21 at node 14B. Port 21B of series resonator 21 is connected to port 22A of series resonator 22 at node 14C. Port 22B of series resonator 22 is connected to terminal 23.

Transmission filter 14 further includes parallel resonators 24, 25, 26 and 27 and inductance elements 28 and 29. Parallel resonator 24 has ports 24A and 24B for inputting and outputting a signal. Parallel resonator 25 has ports 25A and 25B for inputting and outputting a signal. Parallel resonator 26 has ports 26A and 26B for inputting and outputting a signal. Parallel resonator 27 has ports 27A and 27B for inputting and outputting a terminal. Inductance element 28 has ends 28A and 28B. Inductance element 29 has ends 29A and 29B. Port 24A of parallel resonator 24 is connected to node 14A. Port 25A of parallel resonator 25 is connected to port 26A of parallel resonator 26 at node 14B. Port 27A of parallel resonator 27 is connected to node 14C. Port 24B of parallel resonator 24 is connected to port 25B of parallel resonator 25 at node 14D. Port 26B of parallel resonator 26 is connected to port 27B of parallel resonator 27 at node 14E. Inductance element 28 is connected between node 14D and ground 31. End 28A of inductance element 28 is connected to node 14D. Inductance element 29 is connected between node 14E and ground 31. End 29A of inductance element 29 is connected to node 14E. According to the embodiment, end 28B and 29B are connected to ground 31.

In transmission filter 14, parallel resonators 24, 25 and inductance element 28 produce an attenuation pole at a frequency lower than the pass band of transmission filter 14. Parallel resonators 26 and 27 and inductance element 29 produce an attenuation pole at a frequency higher than the pass band of transmission filter 14.

Inductance L2 of inductance element 29 is lower than inductance $L_1$ of inductance element 28.

Parallel resonators 26 and 27 are connected in parallel to a signal path between terminals 18 and 23. The LC series resonance circuit which produces the attenuation pole at the frequency higher than the pass band of transmission filter 14 has impedance $Z_{40}$.

$$Z_{40} = j\omega L_2 + 1/j\omega C$$

Capacitance C in the LC series resonant circuit is a total capacitance of resonators 26 and 27 connected in parallel to each other, and is high. Impedance $Z_{40}$ is accordingly low, hence making a larger attenuation at the frequency higher than the pass band of the transmission filter.

If the capacitance C of the LC series resonant circuit is not large, the resonance frequency of the LC series resonant circuit is lowered, preventing the transmission filter from having a large attenuation at frequencies higher than the pass band of transmission filter 14. However, inductance $L_2$ of inductance element 29 lower than inductance $L_1$ of inductance element 28 raises resonance frequency F of the circuit, accordingly providing transmission filter 14 with a sufficient attenuation at the frequencies higher than the pass band of transmission filter 14. Consequently, in antenna duplexer 40, transmission filter 14 suppresses a spurious caused due to harmonics contained in the transmission signal.

Inductance L2 of inductance element 29 is preferably smaller than ⅕ of inductance L1 of inductance element 28. This arrangement allows the circuit to produce an attenuation pole having a large attenuation at frequencies about two times higher than frequencies in the pass band of transmission filter 14 or at even higher frequency than that.

The capacitance of parallel resonator 25 is preferably larger than that of parallel resonator 26. This arrangement lowers a resonance frequency of the LC series resonance circuit which produces an attenuation pole at a frequency lower than the pass band of transmission filter 14. Consequently, inductance $L_1$ of inductance element 28 can be small, accordingly providing inductance element 28 with a small length and providing transmission filter 14 with a small size.

In communication device 1001 shown in FIG. 1A, transmission circuit 1001B is implemented by a semiconductor integrated circuit, and reception circuit 1001C includes a reproduction device. Transmission filter 14 of antenna duplexer 40 suppresses the spurious caused by the harmonics of the transmission signal, providing the communication device or the mobile telephone with high communication quality.

Figure 2:
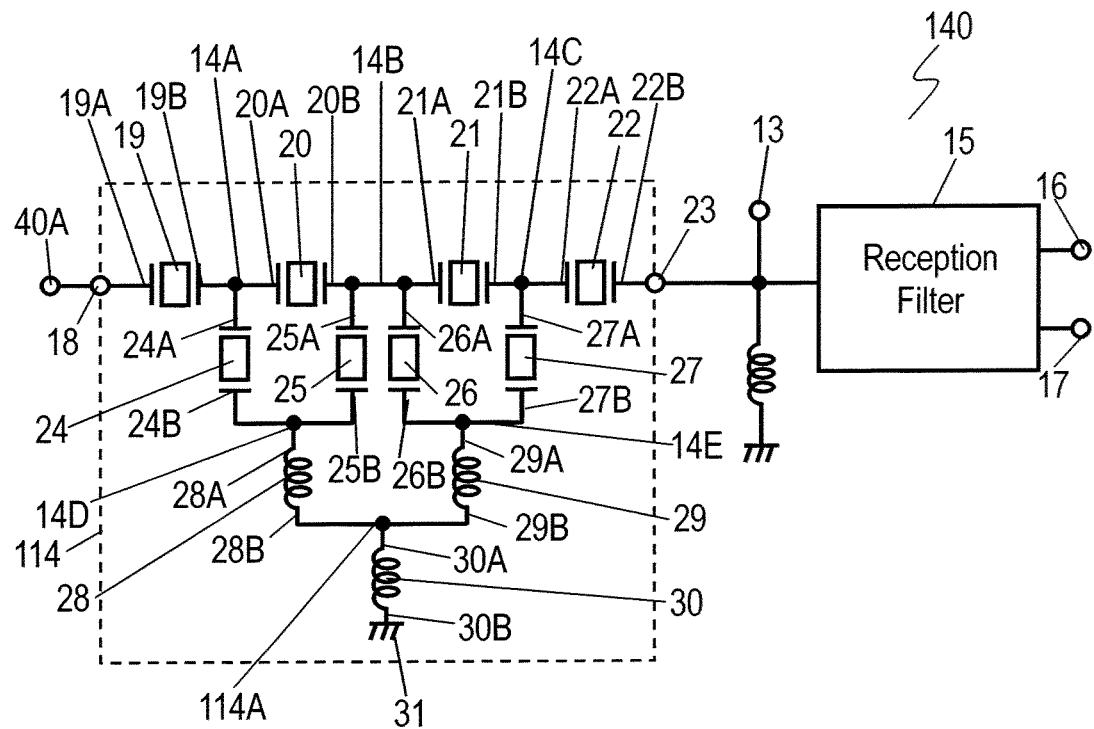
FIG. 2 is a circuit diagram of another antenna duplexer according to the embodiment.

FIG. 2 is a circuit diagram of other antenna duplexer 140 according to the embodiment. In FIG. 2, components identical to those of antenna duplexer 40 shown in FIG. 1B are denoted by the same reference numerals. Antenna duplexer 140 includes transmission filter 114 instead of transmission filter 14 of antenna duplexer 40 shown in FIG. 1B. Transmission filter 114 further includes inductor element 30 having ends 30A and 30B to transmission filter 14 shown in FIG. 1B.

As shown in FIG. 2, in transmission filter 114, inductance element 28 is connected between node 14D and ground 31. Inductance element 29 is connected between node 14D and ground 31, similarly to transmission filter 14 in FIG. 1B. End 28A of inductance element 28 is connected to node 14D. End 29A of inductance element 29 is connected to node 14E.

In transmission filter 114 shown in FIG. 2, ends 28B and 29B of inductance element 28 and 29 are connected to each other at node 114A. Inductance element 30 is connected between node 114A and ground 31. End 30A of inductance element 30 is connected to node 114A. End 30B of inductance element 30 is connected to ground 31. End 30A of inductance element 30 is connected to ends 28B and 29B of inductance elements 28 and 29. Thus, in transmission filter 114, ends 28B and 29B of inductance element 28 and 29 are coupled with ground 31 via inductance element 30.

A current flowing through inductance element 30 is the sum of respective currents flowing through inductance elements 28 and 29, hence increasing impedance of inductance element 30. This arrangement provides inductance elements 28 and 29 with small inductances, accordingly providing inductance elements 28 and 29 with short lengths and providing transmission filter 114 with a small size.

Even in the case that communication device 1001A shown in FIG. 1A includes antenna duplexer 140 shown in FIG. 2 instead of antenna duplexer 40, transmission filter 114 suppresses the spurious caused by the harmonics of the transmission signal, hence providing the communication device, the mobile telephone, with high communication quality.

Figure 3:
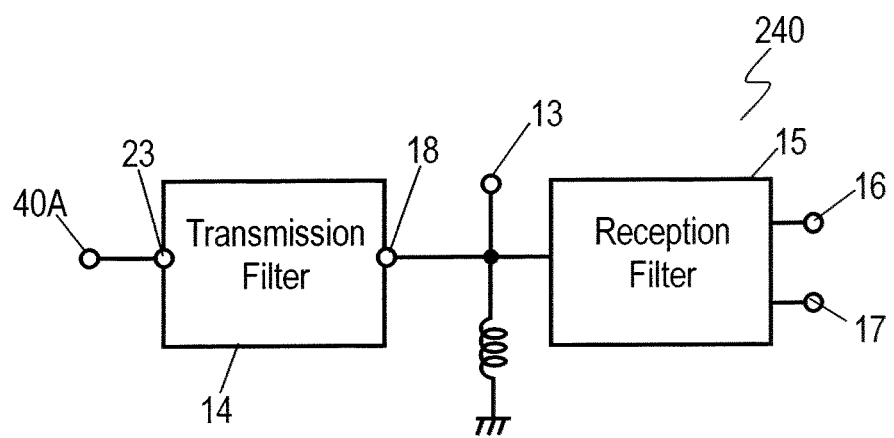
FIG. 3 is a circuit diagram of still another antenna duplexer according to the embodiment.

FIG. 3 is a circuit diagram of still another antenna duplexer 240 according to the embodiment. In antenna duplexer 40 and 140 shown in FIGS. 1B and 2, terminal 18 is an input terminal for inputting a transmission signal to transmission filters 14 and 114, and terminal 23 is an output terminal for outputting a signal from transmission filters 14 and 114. In antenna duplexer 240 shown in FIG. 3, terminal 18 of transmission filters 14 and 114 is connected to antenna terminal 13 for outputting a transmission signal, and terminal 23 is connected to transmission circuit 1001B for inputting a transmission signal to transmission filter 14, providing the same effects as that of antenna duplexers 40 and 140. However, in antenna duplexers 40 and 140 shown in FIGS. 1B and 2, inductance element 28 having high inductance $L_1$ and a large length may be located farther away from antenna terminal 13 so as to maintain isolation between inductance element 28 and antenna terminal 13.

As described above, transmission filter 14 is adapted to be connected with transmission circuit 1001B and is connected to antenna terminal 13. Reception filter 15 is adapted to be connected with reception circuit 100C and is connected to antenna terminal 13. Terminal 18 is adapted to be coupled with one of transmission circuit 1001B and antenna terminal 13. Terminal 23 is adapted to be coupled with another of transmission circuit 100B and antenna terminal 13. Port 20A of series resonator 20 is coupled with terminal 18 via series resonator 19. Port 21A of series resonator 21 is connected to port 20B of series resonator 20 at node 14B. Port 21B of series resonator 21 is coupled with terminal 23 via series resonator 22. Port 24A of parallel resonator 24 is connected to port 20A of series resonator 20. Parallel resonator 25 has port 25A connected to node 14B. Port 25B is connected to port 24B of parallel resonator 24 at node 14D. Port 26A of parallel resonator 26 is connected to node 14B. Parallel resonator 27 has port 27A connected to port 21B of series resonator 21 and port 27B connected to port 26B of parallel resonator 26 at node 14E. Inductance element 28 has end 28A connected to node 14D and end 28B connected and coupled with ground 31. Inductance element 29 has end 29A connected to node 14E and end 29B connected and couple with ground 31.

INDUSTRIAL APPLICABILITY

In an antenna duplexer according to the present invention, a transmission filter sufficiently suppresses a spurious caused due to harmonics contained in a transmission signal. The duplexer is useful for a communication device, such as a mobile telephone.

REFERENCE NUMERALS

13 Antenna Terminal
14 Transmission Filter
14B Node (First Node)
14D Node (Second Node)
14E Node (Third Node)
15 Reception Filter
18 Terminal (First Terminal)
20 Series Resonator (First Series Resonator)
21 Series Resonator (Second Series Resonator)
23 Terminal (Second Terminal)
24 Parallel Resonator (First Parallel Resonator)
25 Parallel Resonator (Second Parallel Resonator)
26 Parallel Resonator (Third Parallel Resonator)
27 Parallel Resonator (Fourth Parallel Resonator)
28 Inductance Element (First Inductance Element)
29 Inductance Element (Second Inductance Element)
30 Inductance Element (Third Inductance Element)
31 Ground
40 Antenna Duplexer
1001 Communication Device
1001A Antenna
1001B Transmission Circuit
1001C Reception Circuit

The invention claimed is:
1. An antenna duplexer comprising:
an antenna terminal adapted to be connected with an antenna;
a transmission filter connected to the antenna terminal and adapted to be coupled with a transmission circuit; and
a reception filter connected to the antenna terminal and adapted to be coupled with the reception circuit, wherein
a pass band of the transmission filter is lower than a pass band of the reception filter,
the transmission filter includes
a first terminal adapted to be coupled with one of the transmission circuit and the antenna terminal,
a second terminal adapted to be coupled with one of another of the transmission circuit and the antenna terminal,
a first series resonator having a first port and a second port, the first port of the first series resonator being coupled with the first terminal,
a second series resonator having a first port and a second port, the first port of the second series resonator being connected to the second port of the first series resonator at a first node, the second port of the second series resonator being coupled with the second terminal,
a first parallel resonator having a first port and a second port, the first port of the first parallel resonator being connected to the first port of the first series resonator,
a second parallel resonator having a first port and a second port, the first port of the second parallel resonator being connected to the first node, the second port of the second parallel resonator being connected to the second port of the first parallel resonator at a second node,
a third parallel resonator having a first port and a second port, the first port of the third parallel resonator being connected to the first node,
a fourth parallel resonator having a first port and a second port, the first port of the fourth parallel resonator being connected to the second port of the second series resonator, the second port of the fourth parallel resonator being connected to the second port of the third parallel resonator at a third node, a first inductance element having a first end and a second end, the first end of the first inductance element being connected to the second node, the second end of the first inductance element being coupled with a ground, and a second inductance element having a first end and a second end, the first end of the second inductance element being connected to the third node, the second end of the second inductance element being coupled with the ground, the first parallel resonator, the second parallel resonator, and the first inductance element produce an attenuation pole at a frequency lower than a pass band of the transmission filter, the third parallel resonator, the fourth parallel resonator, and the second inductance element produce an attenuation pole at a frequency higher than a pass band of the transmission filter, and an inductance of the second inductance element is lower than an inductance of the first inductance element.

2. The antenna duplexer according to claim 1, wherein the inductance of the second inductance element is smaller than 1/5 of the inductance of the first inductance element.

3. The antenna duplexer according to claim 1, wherein a capacitance of the second parallel resonator is larger than a capacitance of the third parallel resonator.

4. The antenna duplexer according to claim 1, wherein
the first terminal is adapted to be coupled with the transmission circuit, and
the second terminal is connected to the antenna terminal.

5. The antenna duplexer according to claim 1, wherein
the second end of the first inductance element is connected to the ground, and
the second end of the second inductance element is connected to the ground.

6. The antenna duplexer according to claim 1, further including a third inductance element having a first end and a second end, the first end of the third inductance element being connected to the second end of the first inductance element and to the second end of the second inductance element, the second end of the third inductance element being connected to the ground.

7. A communication device comprising:
an antenna;
a transmission circuit;
a transmission filter coupled with the transmission circuit and the antenna;
a reception circuit; and
a reception filter coupled with the reception circuit and the antenna, wherein
a pass band of the transmission filter is lower than a pass band of the reception filter,
the transmission filter includes
a first terminal adapted to be coupled with one of the transmission circuit and the antenna terminal,
a second terminal adapted to be coupled with one of another of the transmission circuit and the antenna terminal,
a first series resonator having a first port and a second port, the first port of the first series resonator being coupled with the first terminal,
a second series resonator having a first port and a second port, the first port of the second series resonator being connected to the second port of the first series resonator at a first node, the second port of the second series resonator being coupled with the second terminal,
a first parallel resonator having a first port and a second port, the first port of the first parallel resonator being connected to the first port of the first series resonator,
a second parallel resonator having a first port and a second port, the first port of the second parallel resonator being connected to the first node, the second port of the second parallel resonator being connected to the second port of the first parallel resonator at a second node,
a third parallel resonator having a first port and a second port, the first port of the third parallel resonator being connected to the first node,
a fourth parallel resonator having a first port and a second port, the first port of the fourth parallel resonator being connected to the second port of the second series resonator, the second port of the fourth parallel resonator being connected to the second port of the third parallel resonator at a third node,
a first inductance element having a first end and a second end, the first end of the first inductance element being connected to the second node, the second end of the first inductance element being coupled with a ground, and
a second inductance element having a first end and a second end, the first end of the second inductance element being connected to the third node, the second end of the second inductance element being coupled with the ground,
the first parallel resonator, the second parallel resonator, and the first inductance element produce an attenuation pole at a frequency lower than a pass band of the transmission filter,
the third parallel resonator, the fourth parallel resonator, and the second inductance element produce an attenuation pole at a frequency higher than a pass band of the transmission filter, and
an inductance of the second inductance element is lower than an inductance of the first inductance element.

\* \* \* \* \*